US 7,218,156 B2

(12) United States Patent
Lütkemeyer

(10) Patent No.: US 7,218,156 B2
(45) Date of Patent: *May 15, 2007

(54) SUPPLY TRACKING CLOCK MULTIPLIER

(75) Inventor: Christian Lütkemeyer, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/546,183

(22) Filed: Oct. 11, 2006

(65) Prior Publication Data

US 2007/0030044 A1 Feb. 8, 2007

Related U.S. Application Data

(63) Continuation of application No. 10/833,526, filed on Apr. 28, 2004, now Pat. No. 7,123,063.

(51) Int. Cl.
*H03L 7/06* (2006.01)

(52) U.S. Cl. .................. 327/149; 327/158; 327/119

(58) Field of Classification Search ............. 327/291, 327/294, 298, 147–150, 153–159, 161–163
See application file for complete search history.

(56) References Cited

U.S. PATENT DOCUMENTS

| | | | | |
|---|---|---|---|---|
| 5,514,990 | A |   | 5/1996 | Mukaine et al. ............. 327/116 |
| 5,805,003 | A |   | 9/1998 | Hsu ........................... 327/270 |
| 5,838,178 | A |   | 11/1998 | Marbot ....................... 327/116 |
| 5,955,902 | A |   | 9/1999 | Takada et al. ............. 327/116 |
| 5,963,071 | A |   | 10/1999 | Dowlatabadi ............... 327/175 |
| 6,087,864 | A |   | 7/2000 | Aoki ........................... 327/116 |
| 6,091,270 | A | * | 7/2000 | Cauchy ....................... 327/122 |
| 6,100,736 | A | * | 8/2000 | Wu et al. .................... 327/159 |
| 6,118,313 | A | * | 9/2000 | Yakabe et al. ............. 327/116 |
| 6,239,634 | B1 |   | 5/2001 | McDonagh ................. 327/158 |
| 6,246,271 | B1 |   | 6/2001 | Takada et al. ............. 324/116 |
| 6,295,328 | B1 |   | 9/2001 | Kim et al. .................. 375/376 |
| 6,326,826 | B1 |   | 12/2001 | Lee et al. .................... 327/161 |
| 6,359,486 | B1 |   | 3/2002 | Chen .......................... 327/231 |
| 6,441,659 | B1 |   | 8/2002 | Demone ..................... 327/156 |
| 6,445,229 | B1 |   | 9/2002 | Schenck et al. ............ 327/116 |
| 6,631,454 | B1 |   | 10/2003 | Sager .......................... 711/167 |
| 6,653,876 | B2 |   | 11/2003 | Issa et al. .................... 327/158 |
| 6,654,900 | B1 |   | 11/2003 | Cave .......................... 713/501 |
| 6,667,639 | B2 |   | 12/2003 | Oyama ....................... 327/116 |
| 6,759,911 | B2 |   | 7/2004 | Gomm et al. ............... 331/10 |

(Continued)

*Primary Examiner*—Timothy P. Callahan
*Assistant Examiner*—Hai L Nguyen
(74) *Attorney, Agent, or Firm*—McAndrews, Held & Malloy, Ltd.

(57) ABSTRACT

A circuit for and method of operating a supply tracking clock multiplier is provided. An embodiment of the present invention may permit a less power consuming portion of an integrated circuit to operate at a relatively higher average clock rate than a more power consuming portion operating at a relatively lower clock rate, by adjusting the duration of the cycles of the higher frequency clock. The adjustment may be according to the supply voltage changes that result from logic switching activity of the more power consuming portion, and may be performed in a manner that substantially matches the delay behavior of the logic. The phase of the higher frequency clock remains locked to the lower frequency clock. An embodiment of the present invention may reduce the area and cost of an integrated circuit by minimizing the need for other on-chip power supply noise mitigation approaches, while also improving device throughput and performance.

26 Claims, 14 Drawing Sheets

U.S. PATENT DOCUMENTS

| | | |
|---|---|---|
| 6,867,627 B1 | 3/2005 | Murtagh ................ 327/158 |
| 6,937,073 B2 * | 8/2005 | Dally et al. ............. 327/116 |
| 7,123,063 B2 | 10/2006 | Lutkemeyer ............ 327/149 |

* cited by examiner

SUPPLY TRACKING CLOCK MULTIPLIER

RELATED APPLICATIONS

The present application is a continuation of U.S. patent application Ser. No. 10/833,526 entitled "Supply Tracking Clock Multiplier" filed Apr. 28, 2004, now U.S. Pat. No. 7,123,063 issued Oct. 17, 2006, the complete subject matter of which is hereby incorporated herein by reference, in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

In certain applications it is beneficial to run some parts of an integrated circuit (IC) at a higher clock frequency than the majority of the chip. FIG. 1 illustrates an example of clock signals, clk1x 110 and clk2x 120, where clock signal clk2x 120 is twice the frequency of clock signal clk1x 110. Examples of integrated circuits in which portions of the device may operate at a higher frequency include, for example, high performance microprocessors, digital signal processors (DSP), and IC's used for high speed data communications. To generate the higher clock frequencies used in such applications, phase locked loops (PLLs) or delay locked loops (DLLs) may be used. The jitter performance of these PLLs and DLLs is usually one of the key design parameters, and customarily the jitter is minimized to provide equal cycle times, independent of power supply noise. This is typically achieved by using a separate power supply for the higher frequency clock circuitry, or by using circuits having a propagation delay independent of the power supply level.

In many IC devices, the on-chip power supply voltage has a pronounced ripple at the clock frequency of that portion of the device that dominates the power dissipation. This ripple is caused by the clock controlled periodic supply current, which passes through on-chip resistive supply networks, and through the package inductances. The ripple results in a lower than average power supply voltage (i.e., a droop region), during the times when the logic consumes its peak current. The IC circuitry may then experience some inductive overshoot (i.e., an overshoot region) above the average power supply voltage, when the instantaneous current consumed by the logic tapers off. In an edge triggered design, the droop region usually appears close to the rising clock edge, when the majority of the device logic comprises rising-edge-triggered flip-flops.

The propagation delay of logic gates in an IC is a function of the power supply voltage at the time when the circuit evaluates. Higher power supply voltages reduce propagation delay, lower supply voltages result in increased propagation delay.

When one portion of an integrated circuit operates at a higher frequency (e.g. twice the frequency) than another portion that consumes the majority of the power, the higher frequency block is forced to operate in the droop region of the power supply ripple caused by the portion of the circuit that consumes the largest amount of power. FIG. 2 illustrates the outline of an IC 210 comprising a smaller portion 230 that may operate using a higher speed clock than the portion 220 of the IC 210 that consumes the majority of the power. Such a situation typically forces an IC designer to limit the operating speed of higher speed portion 230 of the IC 210 based upon logic propagation delays available at the lower, droop region power supply voltages caused by the large power consuming portion 220, or to incorporate separate sources of power or additional noise reduction circuitry to minimize power supply noise. The minimum power supply voltage in the droop region may be substantially lower than the average supply level, impacting overall device performance, or the additional noise reduction measures may add cost to the device. This design problem can be expected to become more and more pronounced as the device density of ICs increases, the power supply voltages are scaled down, and power supply currents grow.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Aspects of the present invention may be found in a clock multiplier circuit comprising a delay line circuit, a control circuit, and a mixer circuit. The clock multiplier circuit may be disposed on an integrated circuit device having at least one other circuit comprising a plurality of logic gates. In such an embodiment, the delay line circuit may function to produce at each of a plurality of outputs, a delayed version of a first clock signal, the delay of the delay line circuit being dependent upon at least one control signal and a supply voltage. The control circuit may accept as inputs at least two of the plurality of outputs of the delay line circuit, and the control circuit may produce the at least one control signal. The control circuit may be adapted to adjust the at least one control signal in order to maintain a predetermined phase relationship of the at least two of the plurality of outputs of the delay line circuit. The mixer circuit may be adapted to combine a subset of the plurality of outputs of the delay line circuit in order to produce a second clock signal having a number of cycles for each cycle of the first clock signal. The clock multiplier circuit may function to adjust a duration of one or more portions of the second clock signal in response to the supply voltage while producing the number of cycles of the second clock signal during each cycle of the first clock signal and maintaining a predetermined timing relationship of the first and second clock signals.

In an embodiment of the present invention, the delay line circuit may have four outputs, each output being a version of the first clock signal that is delayed by an amount of time equal to a multiple of one fourth the period of the first clock signal. The control circuit may comprise a phase detector circuit for detecting a phase relationship between the at least two of the outputs of the delay line circuit, the phase detector producing an output, and at least one filter for filtering the output of the phase detector, the at least one filter producing the at least one control signal. The predetermined phase relationship of the at least two of the plurality of outputs of the delay line circuit may comprise a phase difference of 360 degrees, and the number of cycles of the second clock signal during each cycle of the first clock signal may be an integer value of at least two. Delay characteristics of the delay line circuit may be adapted to substantially match the delay characteristics of the plurality of logic gates, with regard to changes in the supply voltage.

Further aspects of the present invention may be found in a system comprising at least one processor for processing data. The processor may comprise a plurality of logic gates, a memory communicatively coupled to the at least one processor, where the at least one processor has a clock multiplier circuit. The clock multiplier circuit may comprise a delay line circuit that functions to produce a plurality of signals, each signal being a delayed version of a first clock signal, the amount of delay being dependent upon at least one control signal and a supply voltage. The clock multiplier circuit may also comprise a control circuit that accepts as inputs, at least two of the plurality of signals. The control circuit produces the at least one control signal, and is adapted to maintain a predetermined phase relationship of the at least two of the plurality of signals by adjusting the at least one control signal. In addition, the clock multiplier circuit may comprise a mixer circuit adapted to combine a subset of the plurality of signals in order to produce a second clock signal having a number of cycles for each cycle of the first clock signal. The clock multiplier circuit may function to adjust a duration of one or more portions of the second clock signal in response to the supply voltage, while producing the number of cycles of the second clock signal during each cycle of the first clock signal and maintaining a predetermined timing relationship of the first and second clock signals.

In an embodiment in accordance with the present invention, the control circuit may comprise a phase detector circuit for detecting a phase relationship between the at least two of the plurality of signals, the phase detector producing an output, and at least one filter for filtering the output of the phase detector, the at least one filter producing the at least one control signal. The predetermined phase relationship of the at least two of the plurality of signals may comprise a phase difference of 360 degrees, and the number of cycles of the second clock signal during each cycle of the first clock signal may be an integer value of at least two. Delay characteristics of the delay line circuit may be adapted to substantially match the delay characteristics of the plurality of logic gates, with regard to changes in the supply voltage.

Additional aspects of the present invention may be seen in a method of multiplying a first clock signal to produce a second clock signal. Such a method may comprise receiving the first clock signal, delaying the first clock signal by a plurality of adjustable delays to produce a plurality of delayed signals, and determining a phase relationship of two of the plurality of delayed signals. The method may also comprise modifying the plurality of adjustable delays based upon the phase relationship and a supply voltage, if the phase relationship does not meet a predetermined condition, and refraining from modifying the plurality of adjustable delays based upon the phase relationship and the supply voltage, if the phase relationship meets the predetermined condition. In addition, the method may include generating a second clock signal using at least two of the plurality of delayed signals. Each of the delayed signals may comprise a version of the first clock signal that is delayed by an amount of time equal to an integer multiple of the period of the first clock signal divided by a predetermined integer. The determining may comprise detecting the phase relationship of two of the plurality of delayed signals to produce phase relationship information, and filtering the phase relationship information.

In an embodiment of the present invention, the predetermined condition may comprise a phase difference of 360 degrees, and the number of cycles of the second clock signal occurring during each cycle of the first clock signal may be an integer value of at least two. At least one of the delaying and modifying may be adapted in order to substantially match the delay characteristics of the plurality of adjustable delays to the delay characteristics of a circuit receiving the second clock signal, with regard to changes in the supply voltage.

Aspects of the present invention can also be found in an integrated circuit comprising a first circuit portion that operates at a first average clock rate and having a first power consumption, and a second circuit portion that operates at a second average clock rate and having a second power consumption. The first average clock rate may be higher than the second average clock rate, and the first power consumption may be lower than the second power consumption. The first circuit portion may operate according to a first clock, and a duration of cycles of the first clock may be adjusted. The duration of cycles of the first clock may be adjusted in response to a supply voltage, and the duration of cycles of the first clock may be adjusted to substantially match a delay characteristic of the second circuit portion. The second circuit portion may operate according to a second clock, and the phase of the first clock may be locked to the second clock.

These and other features and advantages of the present invention may be appreciated from a review of the following detailed description of the present invention, along with the accompanying figures in which like reference numerals refer to like parts throughout.

DETAILED DESCRIPTION OF THE INVENTION

Aspects of the present invention address the problem of clock multiplication in integrated circuits. More specifically, aspects of the present invention employ a delay locked loop (DLL) to create a multiplied clock signal where instead of designing for minimum jitter, the DLL is based upon delay elements that track as closely as possible the propagation delay sensitivity of the basic logic gates used in the IC caused by changes in the IC power supply. By using delay elements with this property, a multiplied clock signal that provides increased computation time when the supply droops may be generated. Although much of the following discussion describes an embodiment of the present invention that doubles the frequency of a clock signal, this is not a limitation of the present invention. The arrangement described below may be employed in the generation of other clock multiplication ratios, without departing from the spirit or scope of the present invention.

Figure 3:
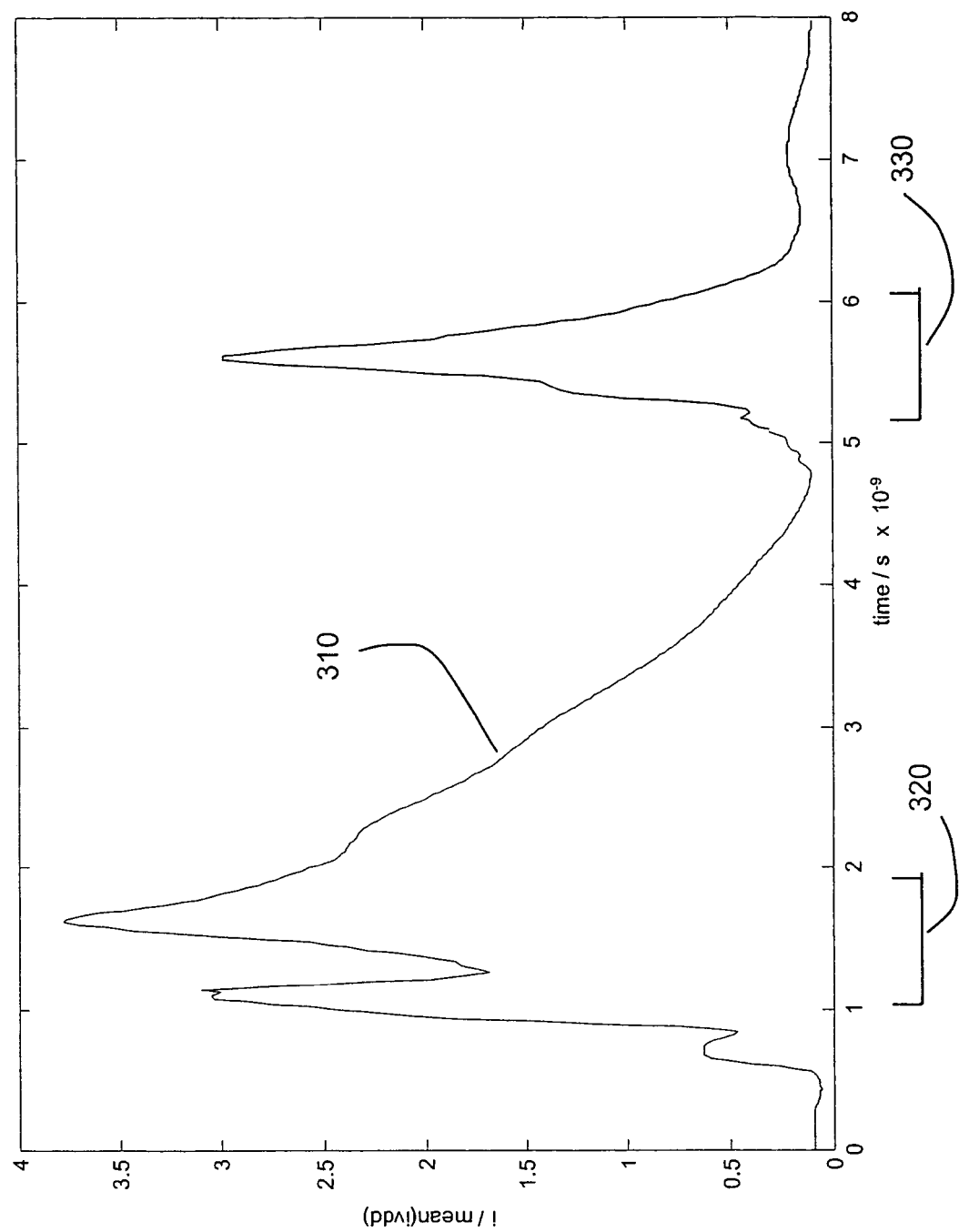
FIG. 3 illustrates the current consumption of a simulated IC device during logic switching using a system clock, clk1x.

As described above, the switching of logic elements in an IC such as, for example, high performance processors, digital signal processors, and high speed data communication devices, may significantly affect power supply voltages available to the logic elements of the device. To help clarify this effect, FIG. 3 illustrates the current consumption of a simulated IC device during logic switching using a system clock, clk1x. The illustration of FIG. 3 shows a rapid increase in supply current in region 320 due to a rising edge of the system clock, clk1x, followed by a smaller yet significant increase in supply current in region 330 due to a falling edge of the system clock, clk1x. These large and rapid changes in IC supply current may be the source of significant power supply noise depending upon, for example, power supply current path resistances and inductances of bonds and lead wires.

Figure 4:
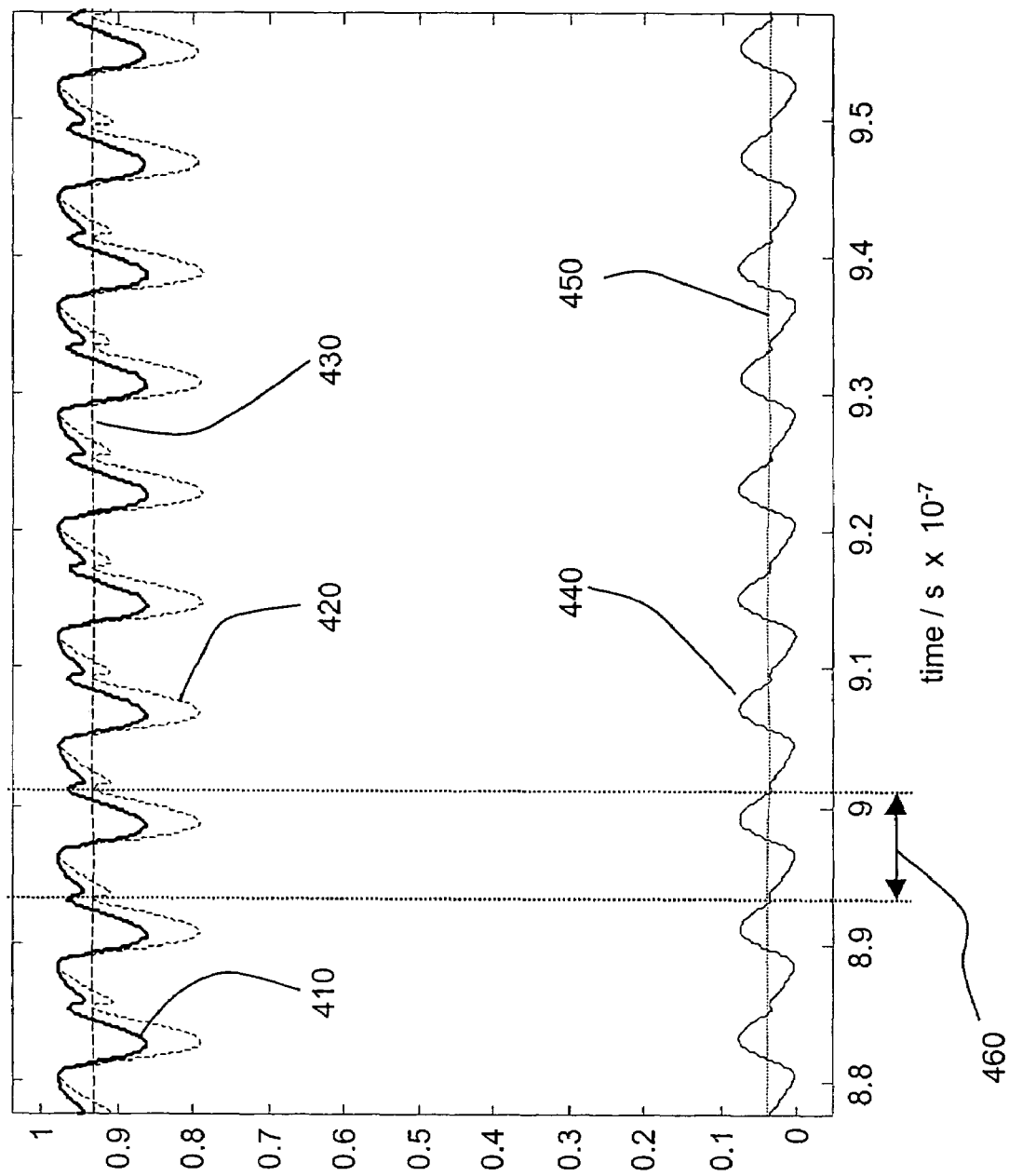
FIG. 4 illustrates worst case power supply voltage noise caused by the large and rapid changes in device supply current due to the simulated IC device power supply current changes shown in FIG. 3.

FIG. 4 illustrates worst case power supply voltage noise caused by the large and rapid changes in device supply current due to the simulated IC device power supply current changes shown in FIG. 3. The illustration of FIG. 4 shows a curve 410 of the simulated Vdd supply voltage, a curve 430 of the simulated Vdd supply averaged over the 8 ns window of the system clock, a curve 440 of the simulated Vss supply voltage, a curve 450 of the value of the simulated Vss supply averaged over the 8 ns window of the system clock, and a curve 420 of the effective supply measured between the Vdd and Vss supplies. As shown in FIG. 4, the switching activity of the simulated IC device generates an estimated 180 mV peak-to-peak supply ripple that is mostly periodic with the system clock, clk1x. As can also be seen in the illustration of FIG. 4, only very small power supply voltage fluctuations remain after the simulated Vdd and Vss supply voltages are averaged over an 8 ns clock cycle window.

Figure 2:
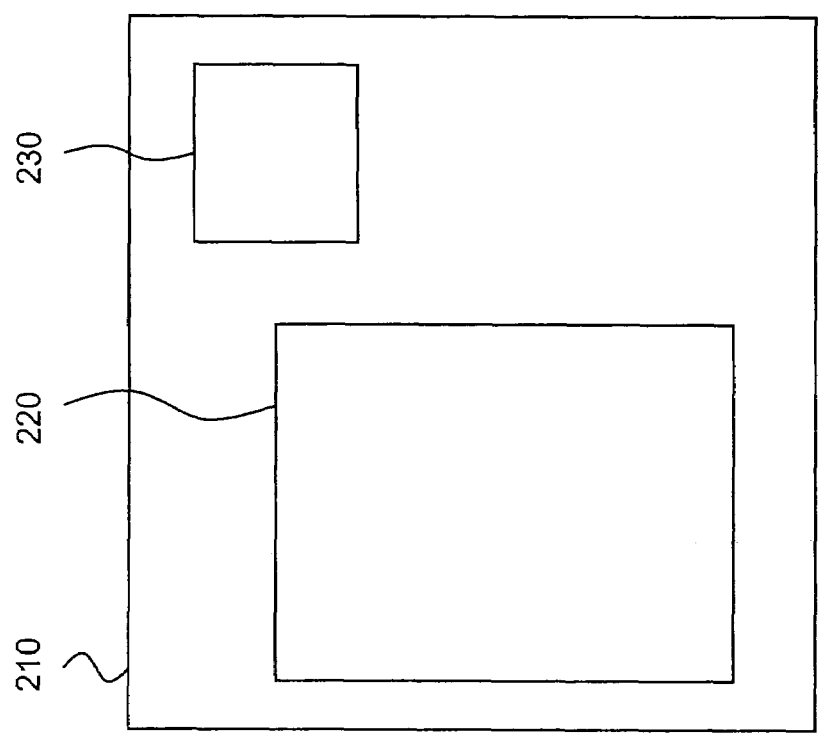
FIG. 2 illustrates the outline of an IC comprising a smaller portion that may operate using a higher speed clock than the portion of the IC that consumes the majority of the power.
Figure 5:
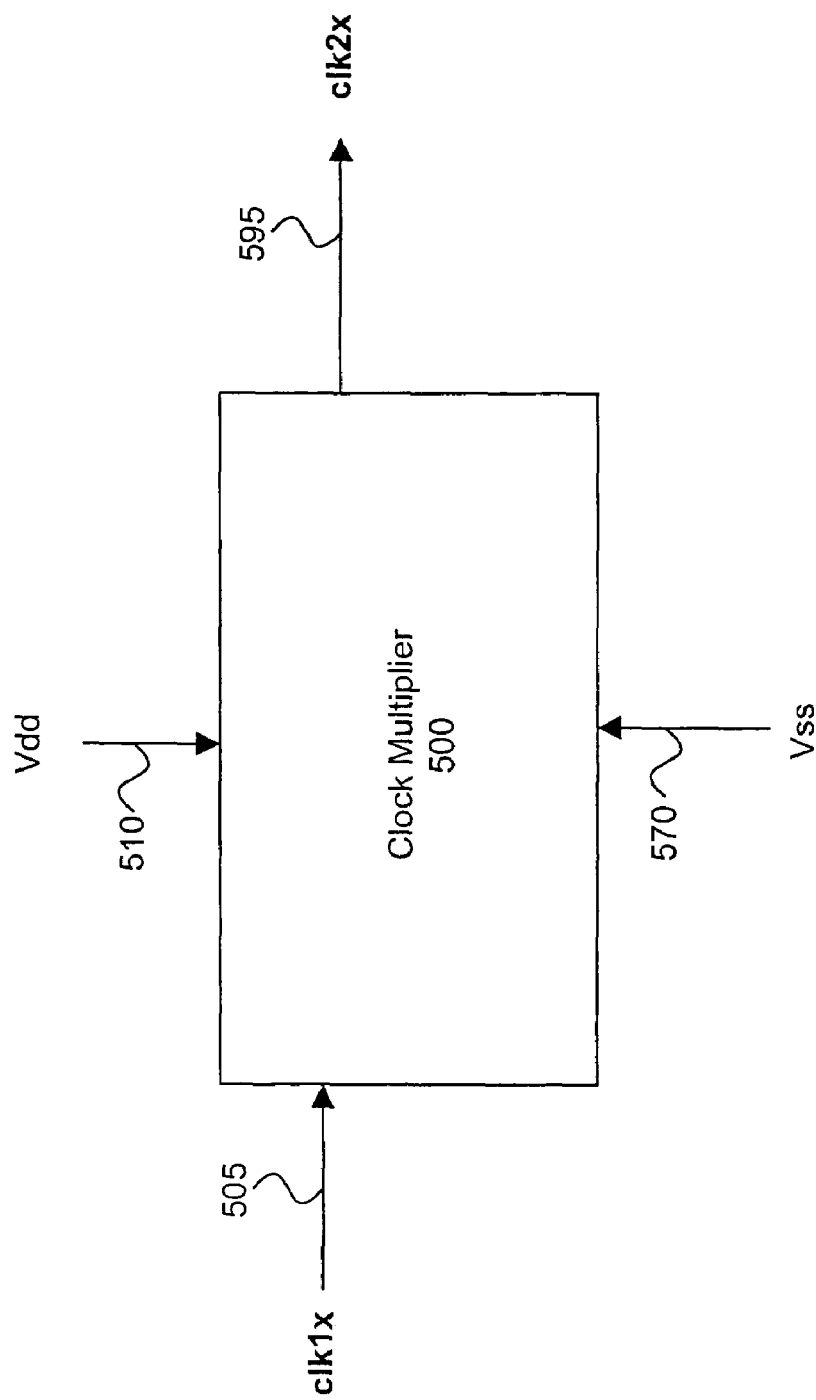
FIG. 5 illustrates a high level block diagram of a clock multiplier circuit, in accordance with an embodiment of the present invention.

FIG. 5 illustrates a high level block diagram of a clock multiplier circuit 500 in accordance with an embodiment of the present invention. The clock multiplier circuit 500 receives as its input a clock signal 505 at a first frequency, and produces as its output a clock signal 595 at a second frequency that is a multiple of the frequency of its input clock signal 505. The circuit operates from power supply voltages Vdd 510 and Vss 570 that are subject to electrical noise generated by other circuitry sharing the Vdd 510 and Vss 570 power supplies. The clock multiplier circuit 500 may be designed to provide a high speed clock signal to a higher speed portion of an IC such as, for example, the portion 230 of IC 210 of FIG. 2.

Figure 6:
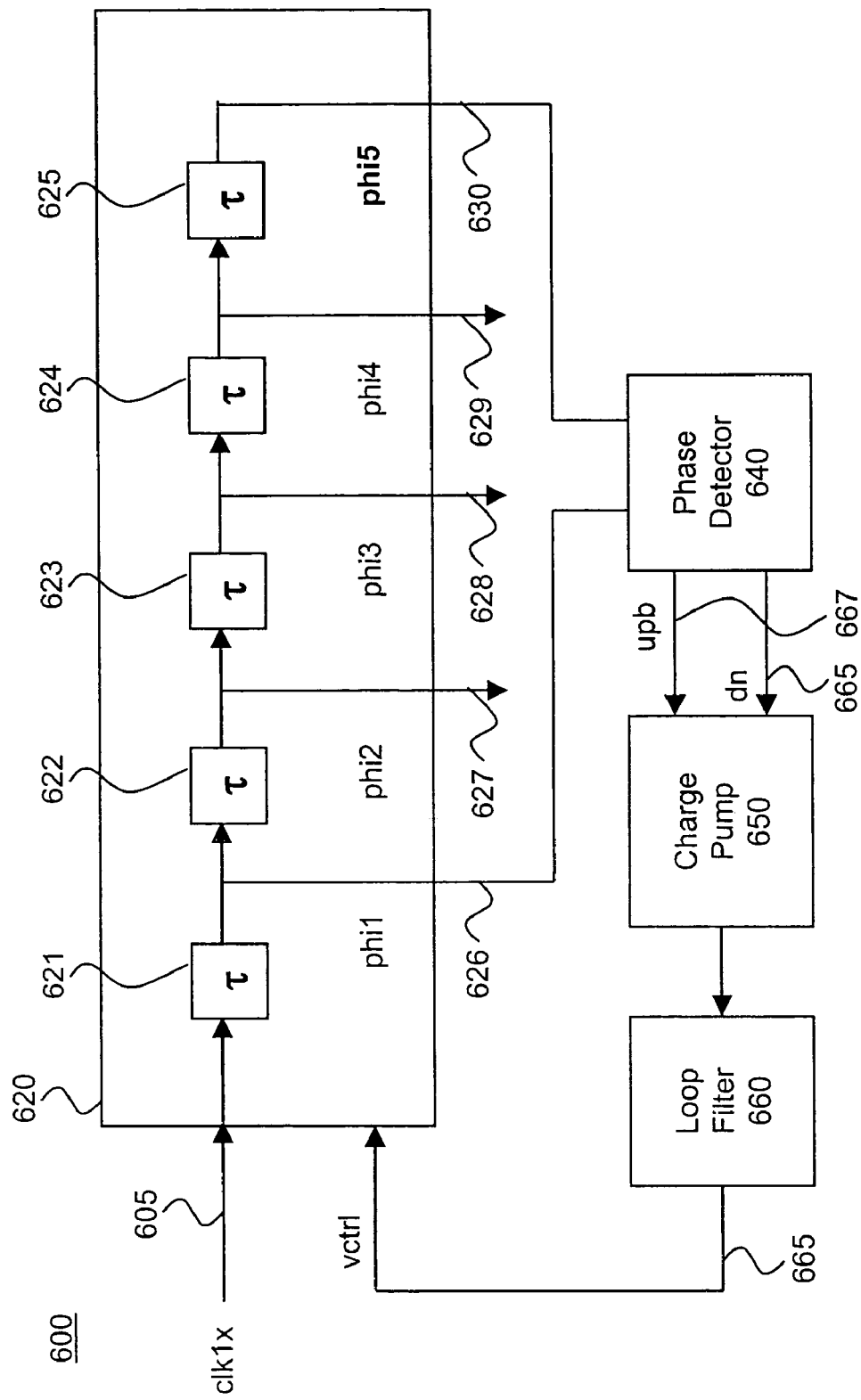
FIG. 6 illustrates a block diagram of an exemplary clock multiplier delay locked loop that may be a part of a clock multiplier circuit such as the clock multiplier of FIG. 5, in accordance with an embodiment of the present invention.

FIG. 6 illustrates a block diagram of an exemplary clock multiplier delay locked loop 600 that may be a part of a clock multiplier circuit such as the clock multiplier 500 of FIG. 5, in accordance with an embodiment of the present invention. As shown in FIG. 6, the delay locked loop 600 comprises a voltage controlled, supply tracking delay line 620, a phase detector 640, a charge pump 650, and a loop filter 660. The voltage controlled, supply-tracking delay line 620 comprises five supply tracking delay elements 621–625 connected in a sequential fashion that create delayed versions of the input clock signal, clk1x 605. As shown in the illustration of FIG. 6, each of the supply tracking delay elements 621–625 produces an output for use by other circuitry of the clock multiplier circuit, to be described in further detail below. A control loop comprising the phase detector 630, the charge pump 640, and the loop filter 650 is arranged to adjust the control voltage, vctrl 660, so that the delay through four of the supply tracking delay elements 622–625, that is, between signal, phi1 626, and signal, phi5 630, equals a phase delay of 360 degrees, i.e. one cycle of the incoming clock signal, clk1x 605. The action of the control loop ensures that each supply tracking delay element 622–625 contributes a 90 degree phase-shift between its input and its output, resulting in the output signals phi1 626, phi2 627, phi3 628, phi4 629 and phi5 630 of delay line 620 having a 90 degree phase separation. Although the illustration of FIG. 6 relates to an embodiment of the present invention providing a clock multiplication ratio of 2, the voltage controlled, supply tracking delay line 620 in various embodiments in accordance with the present invention may have different numbers of delay elements, each providing an equal amount of phase shift of the clock signal to be multiplied. Such embodiments may support generation of clock signals of a different multiple of the input clock signal from the example provided herein, without departing from the scope or spirit of the present invention.

Figure 7:
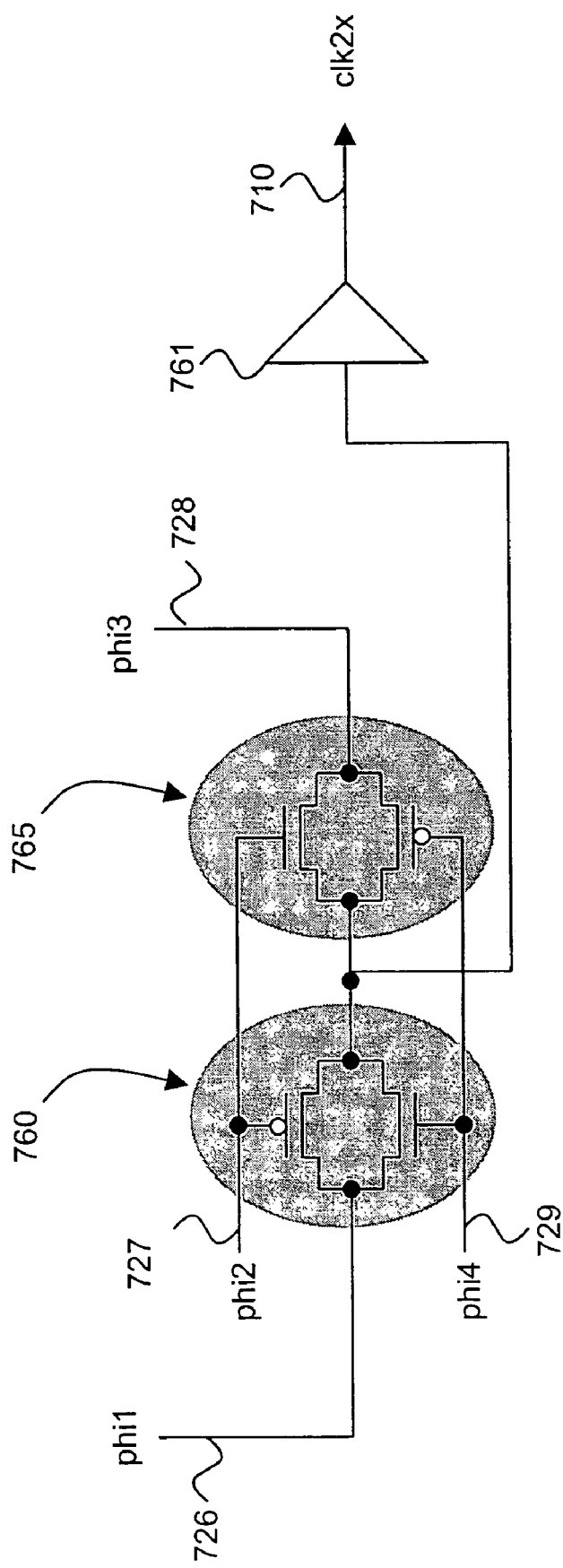
FIG. 7 shows a block diagram illustrating an exemplary mixing circuit for generating a higher frequency clock signal, clk2x, from the outputs of the voltage controlled, supply-tracking delay line of FIG. 6, in accordance with an embodiment of the present invention.
Figure 8:
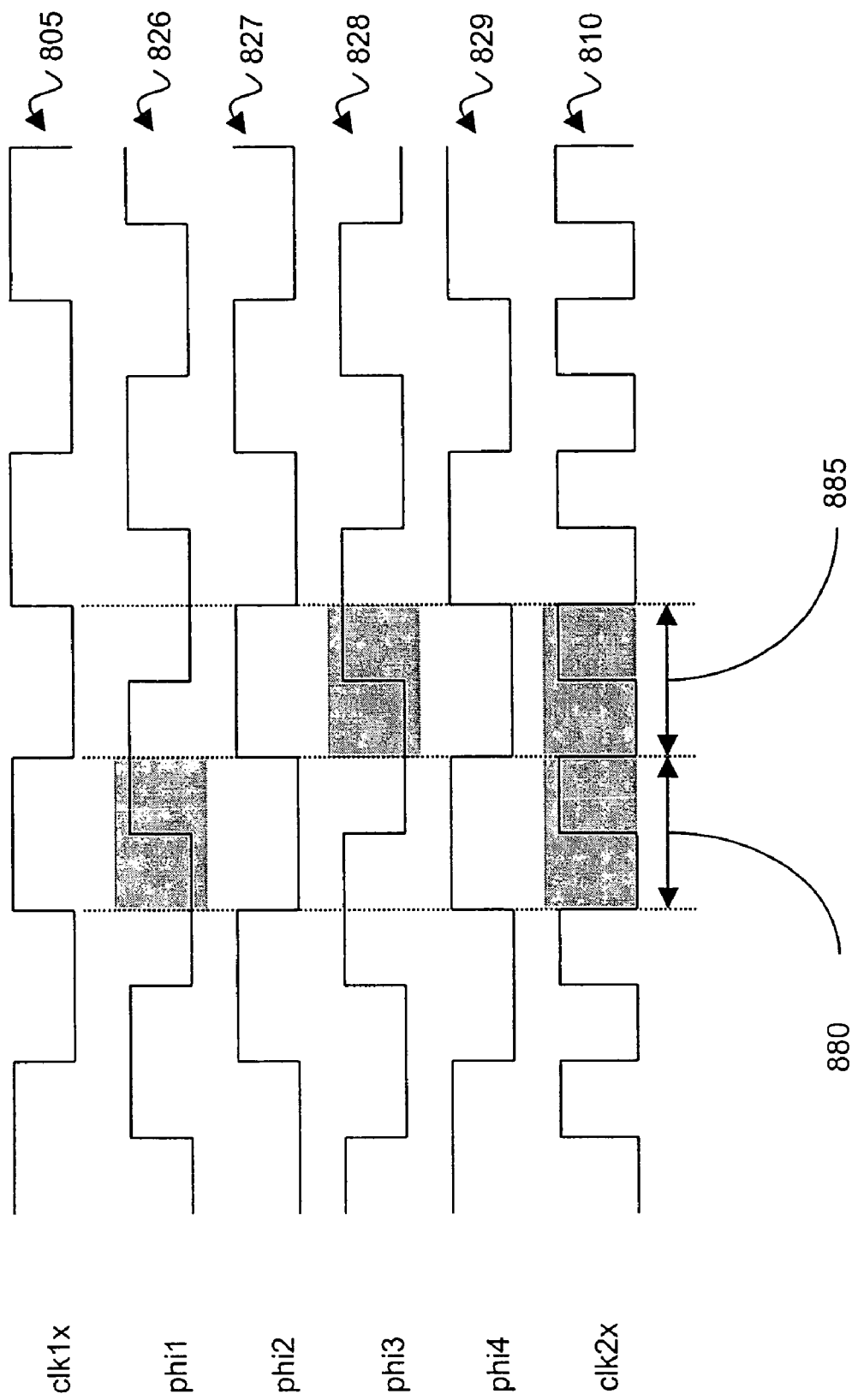
FIG. 8 illustrates clock signals phi1, phi2, phi3, phi4, that may correspond, for example, to clock signals phi1, phi2, phi3, and phi4 of FIG. 7, respectively, along with clock signal clk1x from which they are derived, in accordance with an embodiment of the present invention.

FIG. 7 shows a block diagram illustrating an exemplary mixing circuit 700 for generating a higher frequency clock signal, clk2x 710, from the outputs of the voltage controlled, supply-tracking delay line 620 of FIG. 6, in accordance with an embodiment of the present invention. The multiplied clock signal clk2x 710 is generated by mixing two output signals, 180 degrees apart from each other, from the voltage controlled, supply-tracking delay line 620. As illustrated in FIG. 7, the mixing circuit 700 uses four clock signals phi1 726, phi2 727, phi3 728, and phi4 729, which are separated by a phase delay of 90 degrees, one with respect to the next. FIG. 8 illustrates clock signals phi1 826, phi2 827, phi3 828, phi4 829, that may correspond, for example, to clock signals phi1 726, phi2 727, phi3 728, and phi4 729 of FIG. 7, respectively, along with clock signal clk1x 805 from which they are derived, in accordance with an embodiment of the present invention. Clock signals phi1 726, phi2 727, phi3 728, and phi4 729 of FIG. 7 may also correspond, for example, to the four clock signals phi1 626, phi2 627, phi3 628, and phi4 629, respectively of FIG. 6.

The exemplary mixing circuit illustrated in FIG. 7 operates as follows, with additional reference to the timing diagram of FIG. 8. During the even cycle 880 of FIG. 8, when clock signal phi2 727, 827 is low, and phi4 729, 829 is high, the transmission gate 760 passes the rising transition of signal phi1 726, 826 to the input of the buffer 761 that passes the signal to the clk2x output 710, 810. When clock signals phi2 727, 827 and phi4 729, 829 change their polarity half a clock clk1x 605 cycle later, transmission gate 760 disconnects the clock signal phi1 727, 827 from the input of buffer 761, and transmission gate 765 connects the input of buffer 761 to clock signal phi3 728, 828. This results in a falling clock edge at the input of buffer 761 that is passed to the clk2x output 710, 810. The odd cycle 885 of the clock signal clk2x 710, 810 then begins. After a quarter of a clock clk1x 605 cycle, clock signal phi3 728, 828 makes a transition from low to high, which is passed by transmission gate 765 to the input of buffer 761, and to the clk2x output 710, 810. After another quarter cycle of the clock clk1x signal, phi2 727, 727 and phi4 729, 729 reverse polarity again, and phi1 726, 826 is passed by transmission gate 760 to the input of buffer 761, resulting in a falling transition of the clock signal clk2x 710, 810. This sequence of events repeats for each cycle of the incoming clock signal clk1x 605. Therefore, for each rising edge of the clock signal clk1x 605, two rising edges are created on the output clock signal clk2x 710, 810.

Figure 9:
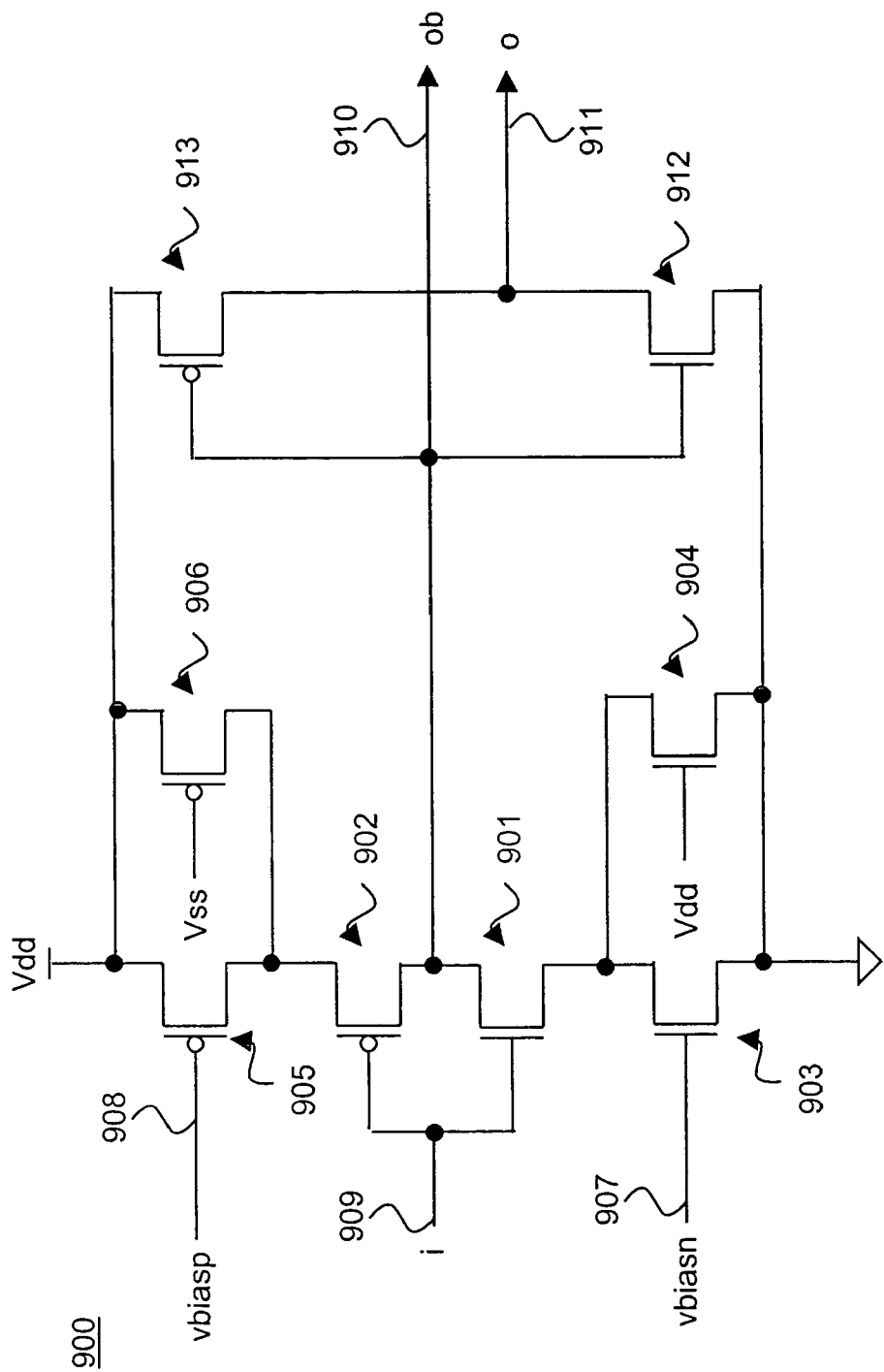
FIG. 9 shows a schematic of an exemplary basic delay element that may be used to implement, for example, the supply tracking delay elements of FIG. 6, in accordance with an embodiment of the present invention.

FIG. 9 shows a schematic of an exemplary basic delay element 900 that may be used to implement, for example, the supply tracking delay elements 621–625 of FIG. 6, in accordance with an embodiment of the present invention. The basic delay element 900 comprises an inverter built from NMOS transistor 901 and PMOS transistor 902. The pull-down current of the inverter is controlled by bias voltage vbiasn 907 to the gate of NMOS transistor 903. NMOS transistor 904 with the gate connected to Vdd provides a minimum current that corresponds to the maximum pull-down delay, if NMOS transistor 903 is shut off completely. Similarly, the pull-up current is controlled by bias voltage vbiasp 908, connected to the gate of PMOS transistor 905. PMOS transistor 906 provides a minimum pull-up current, that corresponds to the maximum pull-up delay, when PMOS transistor 905 is shut off.

The NMOS transistor 904 and the PMOS transistor 906 guarantee that clock pulses are passed through the basic delay element 900, so that the clock edges needed for the control loop of FIG. 6 to function, are not lost when the bias voltages shut off the connected transistors.

The inverter comprising NMOS transistor 912 and PMOS transistor 913 provides a decoupled and inverted output signal, o 911, that may be fed into the phase detector of FIG.

6, or the mixer circuit of FIG. 7, without changing the stage delay of the basic delay element 900.

Figure 10:
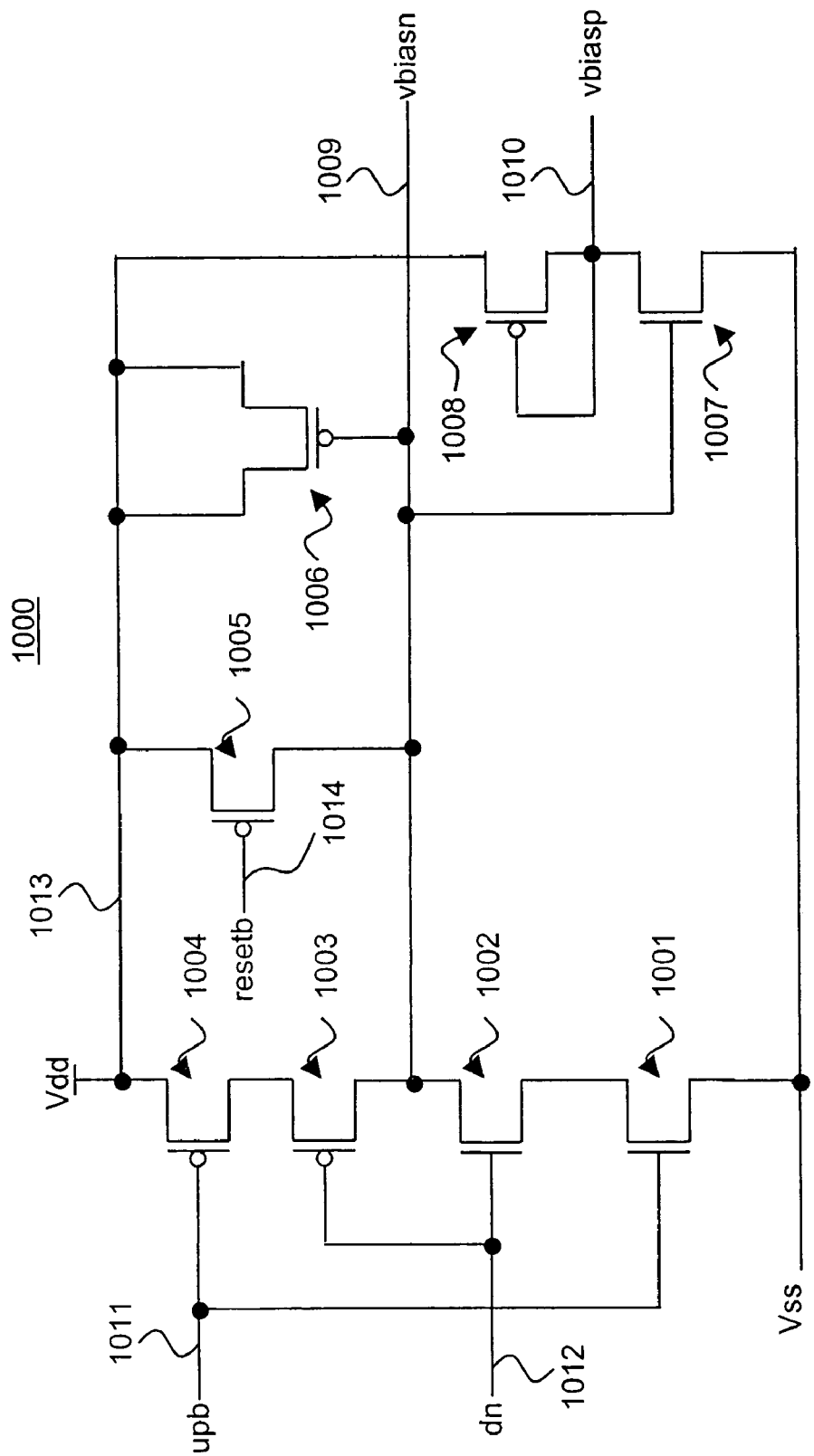
FIG. 10 is a schematic diagram illustrating an exemplary embodiment of a charge pump that may be used to generate bias voltages, vbiasp and vbiasn, for the control of the basic delay elements of a voltage controlled, supply tracking delay line, such as basic delay element of FIG. 9, in accordance with an embodiment of the present invention.

FIG. 10 is a schematic diagram illustrating an exemplary embodiment of a charge pump 1000 that may be used to generate bias voltages, vbiasp 1010 and vbiasn 1009, for the control of the basic delay elements of a voltage controlled, supply tracking delay line, such as basic delay element 900 of FIG. 9, in accordance with an embodiment of the present invention. The bias voltages vbiasp 1010 and vbiasn 1009 of FIG. 10 may correspond, for example, to the bias voltages vbiasp 908 and vbiasn 907 of FIG. 9, respectively. In this example, a phase detector such as, for example, the phase detector 640 of FIG. 6 may provide an active low signal, upb 1011, to raise bias voltage vbiasn 1009, and an active high signal, dn 1012, to lower bias voltage vbiasn 1009. The bias voltage, vbiasn 1009, is lowered when signal, dn 1012, and signal, upb 1011, are high, i.e., when NMOS transistors 1001 and 1002 drain current from the loop capacitor implemented using PMOS transistor 1006. In the exemplary embodiment of FIG. 10, a PMOS transistor 1006 is connected to $V_{dd}$, thereby coupling supply noise from the $V_{dd}$ power supply 1013 onto bias voltage, vbiasn 1009. This improves the delay tracking performance of the supply tracking delay elements of a voltage controlled, supply tracking delay line, in an embodiment in accordance with the present invention. The PMOS transistors 1003 and 1004 raise bias voltage vbiasn 1009, when signals, upb 1011, and, dn 1012, are both low.

The PMOS transistor 1005 provides a reset input 1014, that may be used to initialize the bias voltage vbiasn 1009 close to the level of the Vdd power supply 1013. This action may set the propagation delay of a supply tracking delay element such as, for example, the supply tracking delay element 900 close to its lower delay bound.

The NMOS transistor 1007 converts the bias voltage vbiasn 1009 into a current, which is drawn through the diode-connected PMOS transistor 1008. In an embodiment of the present invention, the voltage drop across the PMOS transistor 1008 may be used as the bias voltage vbiasp 1010 that controls the rising output edge propagation delay of the basic delay element 900.

In an embodiment of the present invention, the supply tracking delay elements 621–625 of FIG. 6 may be constructed by appending a number of basic delay elements such as, for example, the basic delay element 900 of FIG. 9. For example, in a clock multiplier that doubles the input clock signal, each supply tracking delay element such as, for example, the supply tracking delay elements 621–625 of FIG. 6, may provide a quarter clock period of delay. The number of basic delay elements 900 used to realize each supply tracking delay element 621–625 may be calculated by measuring the propagation delay of the basic delay element 900 when device fabrication process conditions result in slow devices, the power supply voltage (i.e., $V_{dd}$–$V_{SS}$) available at the device is low, and the bias voltage, vbiasn 907, is close to the $V_{dd}$ power supply voltage. This set of conditions may be the operating point (i.e., a slow chip and a low power supply voltage) when propagation delay tracking between the multiplied clock and the gates of the device of interest is most important. In this situation, vbiasp 1010 is low because vbiasn 1009 is high. Therefore, the NMOS transistor 903 and the PMOS transistor 905 are on, and the propagation delay of the basic delay element 900 most closely matches the propagation delay of logic gates comprising stacks of two NMOS and two PMOS devices.

Figure 1:
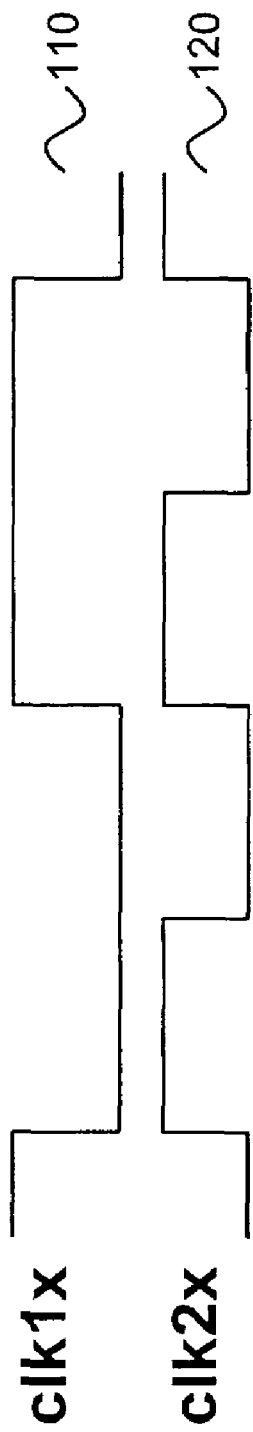
FIG. 1 illustrates an example of clock signals, clk1x and clk2x, where clock signal clk2x is twice the frequency of the clock signal clk1x.
Figure 11:
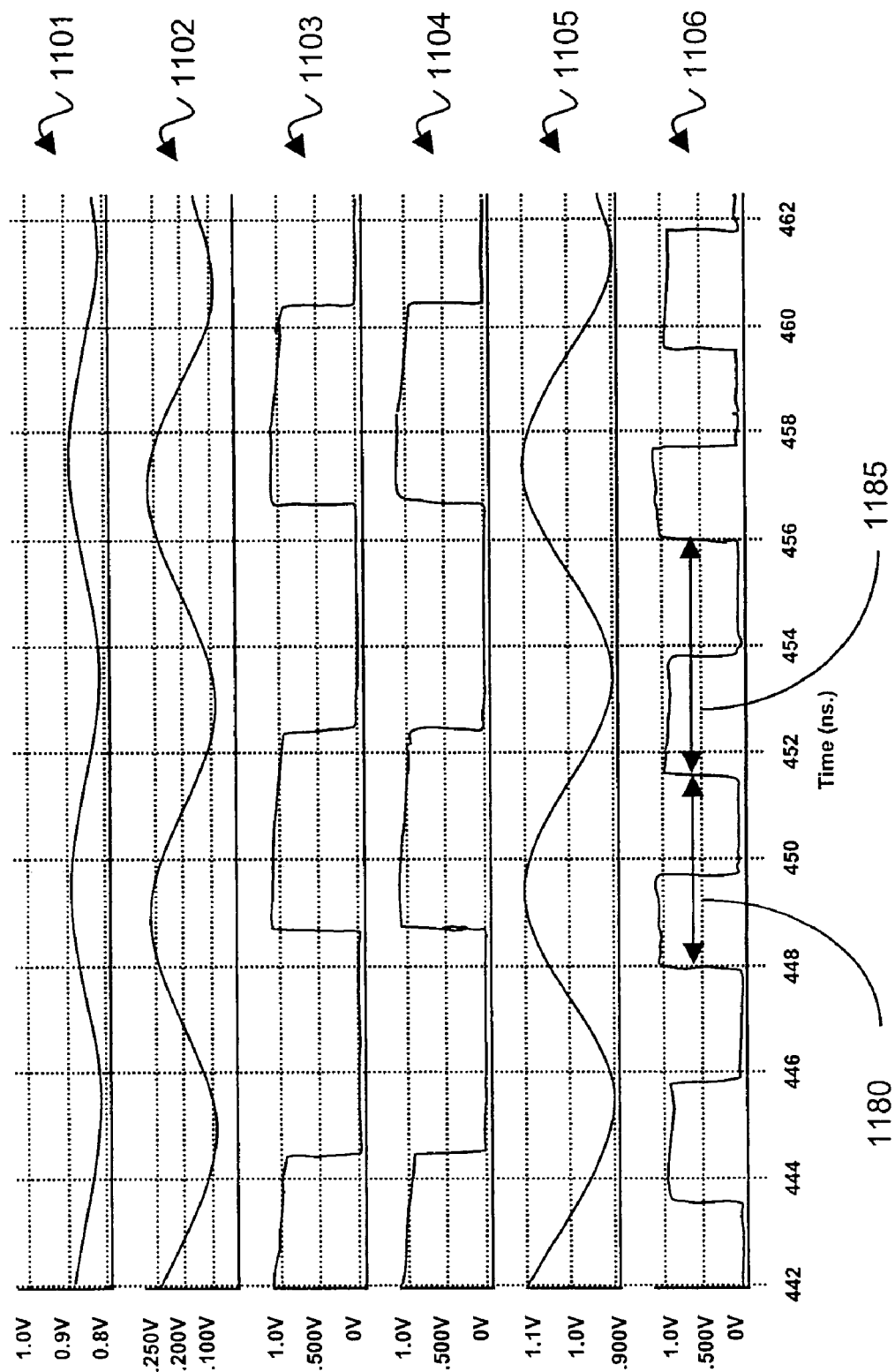
FIG. 11 shows a collection of signal waveforms from a simulation of an exemplary clock multiplier such as the clock multiplier of FIG. 5, in accordance with an embodiment of the present invention.

FIG. 11 shows a collection of signal waveforms from a simulation of an exemplary clock multiplier such as the clock multiplier 500 of FIG. 5, in accordance with an embodiment of the present invention. The simulation was performed assuming a 0.13 um complementary metal-oxide-semiconductor (CMOS) process, Slow—slow CORNER, a power supply voltage (shown by waveform 1105 of FIG. 11) of 1V with a ripple amplitude of delta=0.1V [$V_{dd}$=1.0V+ 0.1V* sin($2\pi f_{clk}$)], cycle time T=1/$f_{clk}$=8 ns, temperature 125 deg C. The waveform 1101 illustrates the bias voltage, vbiasn 907, used to control the NMOS transistors of the basic delay element 900 of FIG. 9. The waveform 1102 illustrates the bias voltage, vbiasp 908, used to control the PMOS transistors of the basic delay element 900 of FIG. 9. The waveform 1103 shows a delayed version of the input clock, clk1x 110 of FIG. 1 or clk1x 505 of FIG. 5, with a 45 degree phase delay, and waveform 1104 shows a waveform trailing the signal of waveform 1103 by 360 degree phase shift. The signals shown by waveforms 1103 and 1104 may correspond, for example, to the input signals to the phase detector 640 of FIG. 6. The voltage controlled, supply tracking delay line in the exemplary embodiment of the simulation, which may correspond to the voltage controlled, supply tracking delay line 620 of FIG. 6, is adjusted to keep the phase difference between these two signals at 360 degrees. The signal clk2x shown by waveform 1106 is the multiplied (doubled) output clock, and may correspond to the multiplied clock signal clk2x 595 of FIG. 5, or clk2x 710 of FIG. 7. It is clearly illustrated by the simulation results shown in FIG. 11 that the even clock cycle 1180 of the simulated multiplied clock signal clk2x 1106 coinciding with the overshoot of the power supply voltage waveform 1105, is significantly shorter than the odd clock cycle 1185 that coincides with the droop of the power supply voltage waveform 1105.

Figure 12:
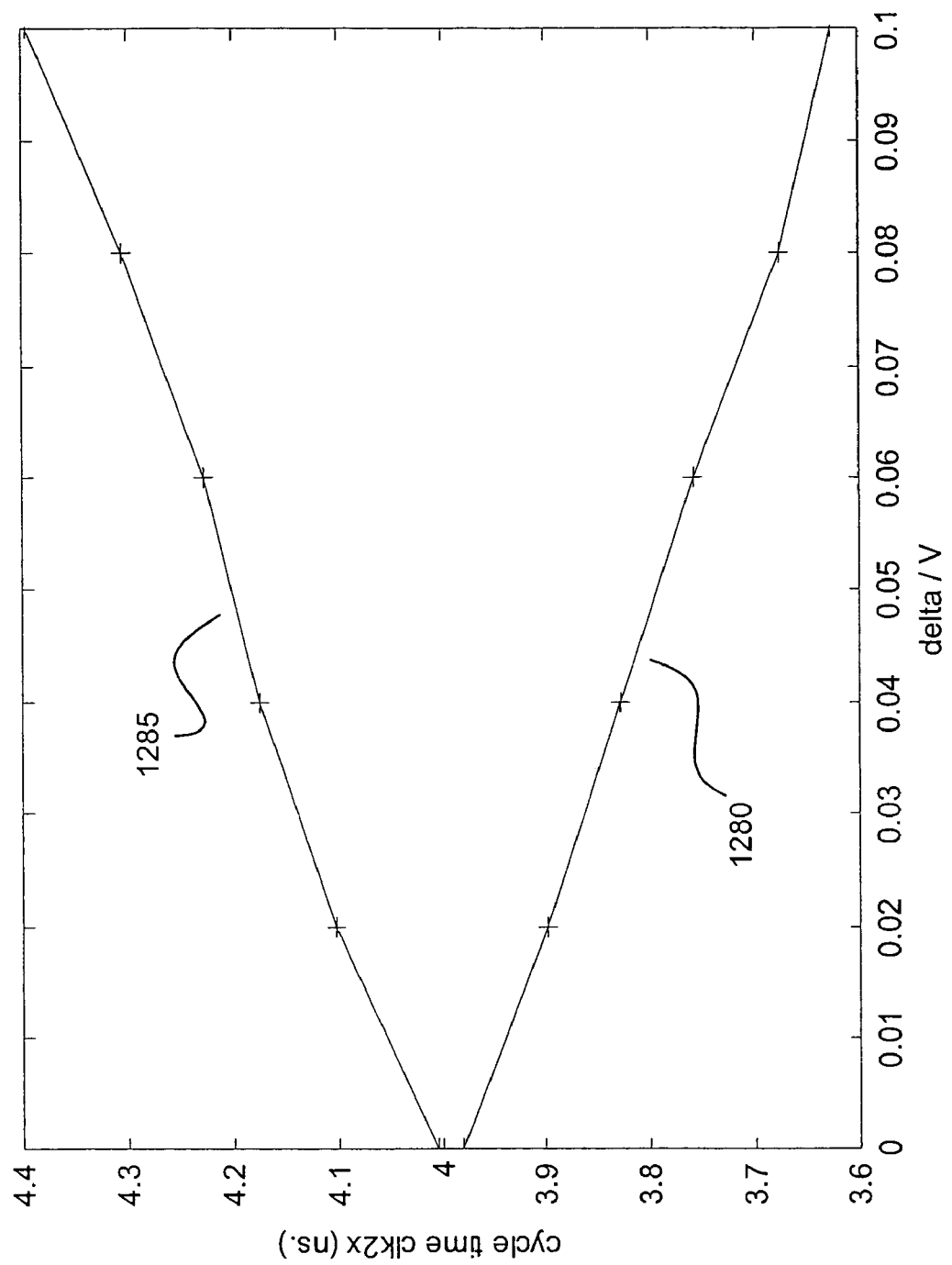
FIG. 12 shows two graphs that illustrate how the even and odd clock cycle times of a supply tracking clock multiplier change with an increasing power supply ripple amplitude delta between 0 and 100 mV, in accordance with an embodiment of the present invention.

FIG. 12 shows two graphs that illustrate how the even 1280 and odd 1285 clock cycle times of a supply tracking clock multiplier change with an increasing power supply ripple amplitude delta between 0 and 100 mV, in accordance with an embodiment of the present invention. The change in clock cycle time is approximately linear with the ripple amplitude delta of the power supply voltage. In the illustration of FIG. 12, the duration of the even cycles decreases, and the duration of the odd cycles increases by a similar amount, so that the sum of two consecutive cycles of the multiplied clock, clk2x, equals the period of the incoming clock, clk1x. It should be noted that although the illustration of FIG. 12 illustrates the behavior of an embodiment of a supply tracking clock multiplier providing a multiplication ratio of 2, the present invention is not limited to use in clock multipliers providing only a clock multiplication ratio of 2, and may be employed with other clock multiplication ratios, without departing from the spirit or scope of the present invention.

Figure 13:
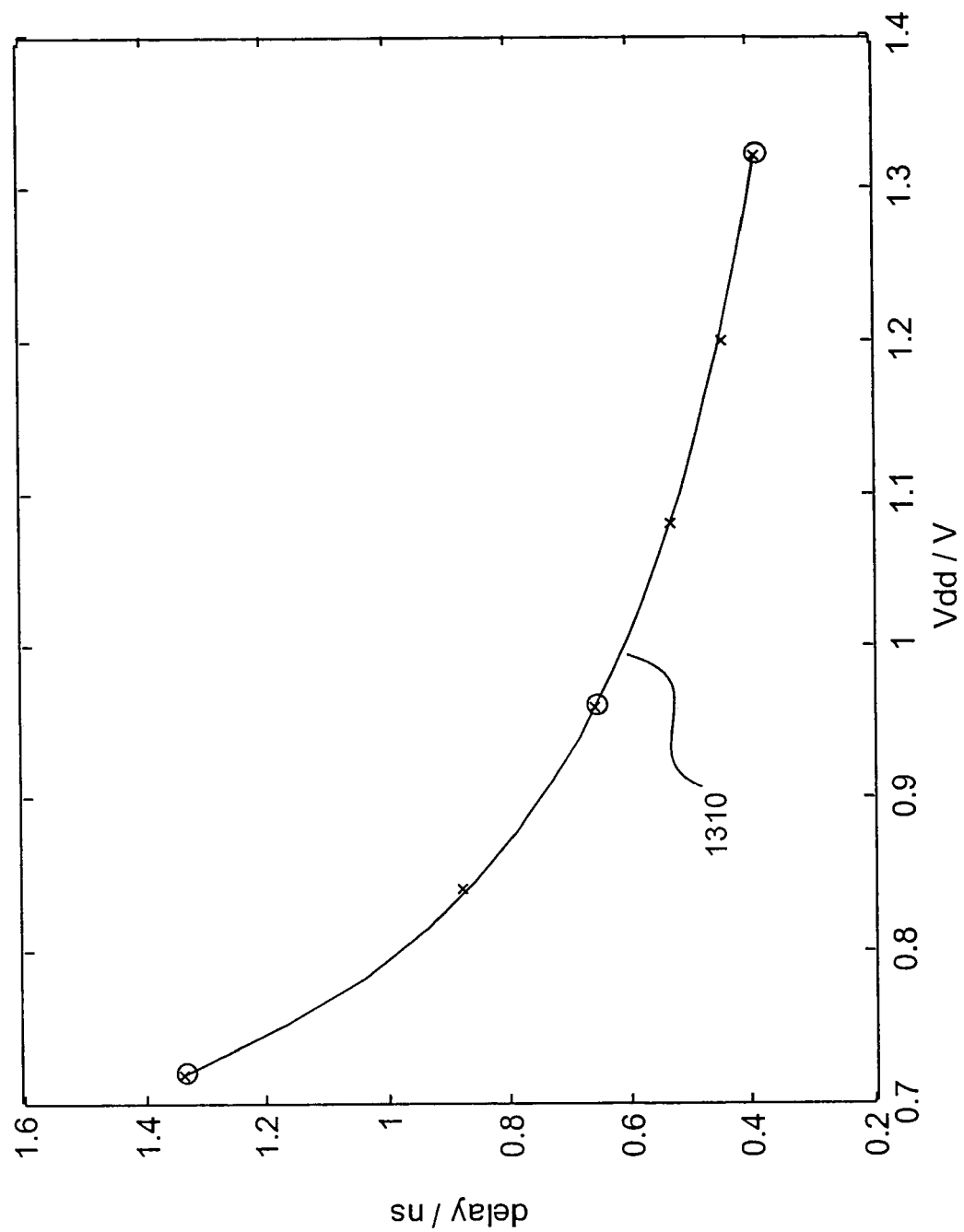
FIG. 13 shows a curve illustrating the dependency of the propagation delay of a full adder in this process upon changes in the power supply voltage, Vdd, in accordance with an embodiment of the present invention.

FIG. 13 shows a curve 1310 illustrating the dependency of the propagation delay of a full adder in this process upon changes in the power supply voltage, Vdd. The propagation delay can be very accurately described by an equation, propagation delay=D/(Vdd−Vt)$^\alpha$, where D=3.14×10$^{-10}$, $\alpha$=0.847, and Vt=0.539.

Figure 14:
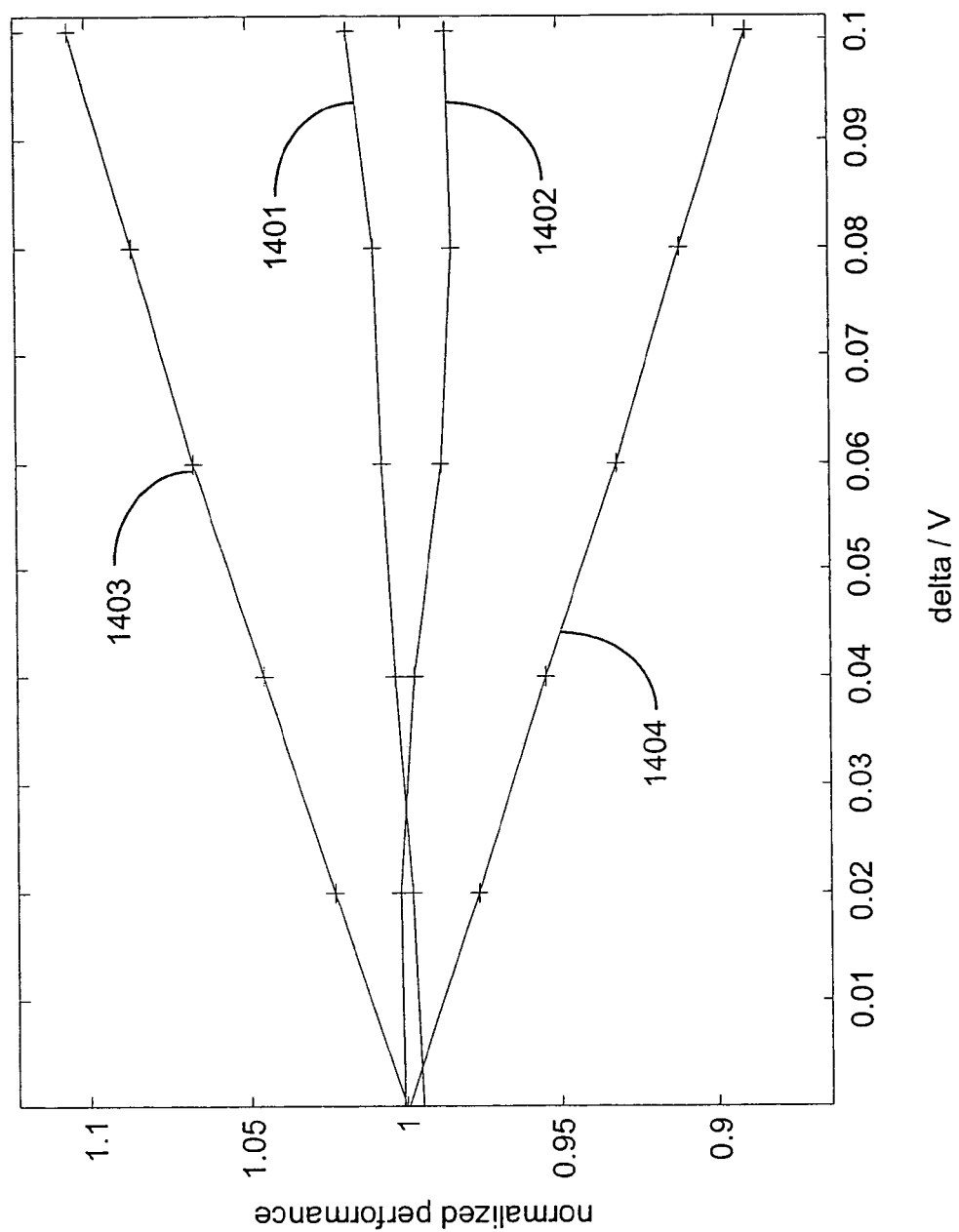
FIG. 14 shows four curves illustrating the normalized performance during even and odd clock cycles, when both a supply tracking clock multiplier and a prior art clock multiplier are employed, respectively, in accordance with an embodiment of the present invention.

FIG. 14 shows four curves 1401, 1402, 1403, 1404 illustrating the normalized performance during even and odd clock cycles, when both a supply tracking clock multiplier and a prior art clock multiplier are employed, respectively, in accordance with an embodiment of the present invention. The curves shown in FIG. 14 were calculated by normalizing the number of gate delays that fit into the odd and even cycle time of the multiplied clock, clk2x. For this comparison the supply dependent instantaneous computation speed was modeled as vlogic=1/delay=(Vdd−Vt)$^\alpha$/D. By integrating vlogic over the respective clock cycle, the number of gates that can evaluate during that cycle may be obtained. If an ideal, jitter free, clk2x is used, the performance in the even cycle increases as shown by curve 1403, when the supply ripple increases, and the performance in the odd cycles decreases as shown by curve 1404, as the average supply during odd cycles drops due to the supply droop. Assuming a supply ripple amplitude of 100 mV, the performance during the odd cycles of a clock multiplier according to the prior art drops by approximately 12%. This is a significant degradation, indicating a pronounced supply ripple dependency of the clk2x logic in the presence of heavy clk1x switching activity. When the doubled clock, clk2x, is generated using a supply tracking DLL in accordance with the present invention, the performance during the even and odd cycles of clk2x, shown by curves 1401 and 1402, respectively, changes by less than 2%, thanks to the cycle width modulation of the supply tracking clock multiplier.

The prior art clock multiplying DLLs attempt to minimize the jitter of the multiplied clock, by using isolated supplies, or by using delay elements that show as little supply dependency as possible (differential current mode delay elements). An embodiment in accordance with the present invention may use delay elements that track the supply/delay performance of logic gates, in order to provide longer execution time when the supply voltage drops. This is accomplished by shortening clock cycles at times when the supply is higher than average. The supply ripple sensitivity of a block that runs at a higher clock frequency than the blocks that are creating the supply ripple is reduced, in an embodiment in accordance with the present invention.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. An integrated circuit device comprising:
    a first circuit portion comprising a plurality of signal processing elements operating from a power supply voltage and having associated signal propagation delays, the signal propagation delays dependent upon the power supply voltage, the first circuit portion responsive to a clock signal having first and second signal portions; and
    a second circuit portion for generating the clock signal, the second circuit portion employing a second plurality of signal processing elements having associated signal propagation delays substantially tracking that of the first circuit portion, the second circuit portion operational to adjust timing of the first and second clock signal portions upon occurrence of a change in the power supply voltage of the first circuit portion.

2. The integrated circuit device according to claim 1, wherein the integrated circuit device comprises any circuitry employing an internal clock that is of higher frequency than that supplied to the integrated circuit device from an external source.

3. The integrated circuit device according to claim 2, wherein the integrated circuit device comprises a digital signal processor.

4. The integrated circuit device according to claim 2, wherein the power consumption of the second circuit portion is a substantially small fraction of the power consumption of the first circuit portion.

5. A clock circuit comprising:
a first circuit responsive to cycles of a clock signal, each cycle comprising a first and a second time portion, the first circuit using an operating supply voltage; and
a second circuit for generating the clock signal in a fixed frequency relationship to a reference clock signal, the second circuit adjusting the first and second time portions in response to changes in the operating supply voltage of the first circuit.

6. The clock circuit according to claim 5, wherein the first circuit and the second circuit reside on the same integrated circuit device.

7. The clock circuit according to claim 5, wherein the power consumption of the second circuit is a substantially small fraction of the power consumption of the first circuit.

8. The clock circuit according to claim 5, wherein the first circuit comprises a digital signal processor.

9. The clock circuit according to claim 5, wherein the fixed frequency relationship comprises at least two cycles of the clock signal for each cycle of the reference clock signal.

10. The clock circuit according to claim 5, wherein the first and second time portions begin on succeeding clock edges, are non-overlapping, and wherein the total duration of the first and second time portions equals the length of the cycle of the clock signal.

11. A generator for producing a clock signal, the generator comprising:
input circuitry for receiving a reference clock signal; and
clock multiplier circuitry operational to, at least,
generate a clock signal having a predetermined number of cycles for each cycle of the reference clock;
determine a change in a power supply voltage of a circuit external to the generator, wherein the power supply voltage change occurs in response to changes in the clock signal; and
adjust a duration of at least one portion of the clock signal in response to the change in power supply voltage of the circuit external to the clock signal generator.

12. The generator according to claim 11, wherein the predetermined number of cycles for each cycle of the reference clock is at least two.

13. The generator according to claim 11, wherein the adjustment in duration of the at least one portion of the clock signal is proximate in time to the change in power supply voltage.

14. The generator according to claim 11, wherein the propagation delay response to the change in power supply voltage of at least one switching element of the generator substantially tracks the propagation delay response to the change in power supply voltage of switching elements of the circuit external to the clock signal generator.

15. A method of generating a clock signal, comprising:
in a first circuit portion,
processing one or more digital signals in response to a clock signal, the first circuit portion employing an operating supply voltage, and in a second circuit portion,
detecting a change in the operating supply voltage of the first circuit portion; and
generating the clock signal, wherein a duration of at least one portion of the clock signal is adjusted to compensate for propagation delay change in the first circuit portion caused by the change in the operating supply voltage, and wherein the clock signal has a predetermined number of cycles for each cycle of a reference clock signal.

16. The method according to claim 15, wherein the first circuit portion and the second circuit portion reside on the same integrated circuit device.

17. The method according to claim 15, wherein the power consumption of the second circuit portion is a substantially small fraction of the power consumption of the first circuit portion.

18. The method according to claim 15, wherein the first circuit portion comprises a processor circuitry.

19. An integrated circuit device comprising a first circuit portion that, during operation, generates a clock signal employed by a separate second circuit portion, the first circuit portion adjusting timing of portions of the clock signal in response to clock signal induced changes in a power supply voltage of the second circuit portion, while maintaining a predetermined number of cycles of the clock signal for each cycle of a reference clock signal.

20. The integrated circuit device according to claim 19, wherein the predetermined number of cycles of the clock signal for each cycle of a reference clock signal comprises at least two cycles of the clock signal for each cycle of the reference clock signal.

21. The integrated circuit device according to claim 19, wherein the integrated circuit device comprises any circuitry employing an internal clock that is of higher frequency than that supplied to the integrated circuit device from an external source.

22. The integrated circuit device according to claim 19, wherein the adjusting timing of portions of the clock signal in response to clock signal induced changes in a power supply voltage of the second circuit portion is accomplished by varying a supply voltage to a delay producing element of the first circuit portion, based upon the changes in the power supply voltage of the second circuit portion.

23. A clock generator circuit comprising:
a clock interface circuit for receiving a reference clock signal;
a voltage monitor circuit for monitoring a level of a power supply voltage used for operating processor circuitry responsive to the clock generator circuit; and
one or more circuits operable to, at least,
generate a second clock signal comprising a plurality of edges, the second clock signal having a predetermined number of cycles for each cycle of the reference clock signal,
transmit the second clock signal to the processor circuitry, the processor circuitry being responsive to edges of the second clock signal,
wherein a position of an edge of the second clock signal is advanced in time, when the level of the power supply voltage is determined to cause a relatively smaller propagation delay in the processor circuitry, and
wherein the position of the edge of the second clock is delayed in time, when the level of the power supply voltage is determined to cause a relatively larger propagation delay in the digital signal processing circuitry.

24. The clock generator circuit according to claim 23, wherein the clock generator circuit and the processor circuitry reside on the same integrated circuit.

25. The clock generator circuit according to claim 23, wherein the predetermined number of cycles for each cycle of the reference clock signal is at least two.

26. The clock generator circuit according to claim 23, wherein the power consumption of the clock generator circuit is a substantially small fraction of the power consumption of the processor circuitry.

* * * * *